(12) United States Patent
Saito et al.

(10) Patent No.: US 9,627,342 B2
(45) Date of Patent: Apr. 18, 2017

(54) ELECTRONIC COMPONENT AND METHOD OF MANUFACTURING ELECTRONIC COMPONENT

(71) Applicant: FUJI ELECTRIC CO., LTD., Kawasaki-shi (JP)

(72) Inventors: Takashi Saito, Nagano (JP); Tatsuo Nishizawa, Matsumoto (JP); Yoshito Kinoshita, Nagano (JP); Norihiro Nashida, Nagano (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 325 days.

(21) Appl. No.: 14/019,780

(22) Filed: Sep. 6, 2013

(65) Prior Publication Data

US 2014/0001636 A1   Jan. 2, 2014

Related U.S. Application Data

(63) Continuation of application No. PCT/JP2012/056036, filed on Mar. 8, 2012.

(30) Foreign Application Priority Data

Mar. 10, 2011  (JP) ................... 2011-053633

(51) Int. Cl.
  *H01L 23/48* (2006.01)
  *H01L 23/52* (2006.01)
  (Continued)

(52) U.S. Cl.
  CPC ............ *H01L 24/29* (2013.01); *C23C 18/165* (2013.01); *C23C 18/1651* (2013.01);
  (Continued)

(58) Field of Classification Search
  CPC . H01L 2224/85181; H01L 2224/73265; H01L 2224/45144; H01L 2924/15311;
  (Continued)

(56) References Cited

U.S. PATENT DOCUMENTS 5,452,842 A * 9/1995 Melton ................ B23K 35/007
                                                    228/180.22
6,051,879 A * 4/2000 Jiang ...................... H01L 24/12
                                                       257/750

(Continued)

FOREIGN PATENT DOCUMENTS

JP       07-263493 A   10/1995
JP       3484367 B2    10/2003
(Continued)

OTHER PUBLICATIONS

Hayashida et al. (JP 07-263493) Machine translation.*
Machine translation of Japanese reference Hayashida et al. (07-263493) Cited in IDS dated Sep. 6, 2013.*

*Primary Examiner* — John M Parker
(74) *Attorney, Agent, or Firm* — Rossi, Kimms & McDowell LLP

(57) ABSTRACT

Plating pre-processing is carried out before carrying out a plating process on the surface of a conducting section provided on a semiconductor wafer. A first metal film is formed on the surface of the conducting section by NiP alloy plating process. A second metal film is formed on the surface of the first metal film by immersion Ag plating process. The semiconductor wafer is diced and cut into semiconductor chips. A conductive composition containing Ag particles is applied to the surface of the second metal film which is on the front surface of the semiconductor chip. A bonding layer containing Ag particles is formed by sintering the conductive composition through heating. A metal plate is then bonded to the surface of the second metal film via the (Continued)

bonding layer containing Ag particles. The electronic component has high bonding strength, excellent thermal resistance and heat radiation properties.

23 Claims, 11 Drawing Sheets

(51) Int. Cl.
*H01L 29/40* (2006.01)
*H01L 23/00* (2006.01)
*C25D 5/12* (2006.01)
*C23C 18/16* (2006.01)
*C23C 28/02* (2006.01)
*C23C 18/36* (2006.01)
*C23C 18/54* (2006.01)

(52) U.S. Cl.
CPC .......... *C23C 18/1653* (2013.01); *C23C 28/02* (2013.01); *C23C 28/022* (2013.01); *C23C 28/023* (2013.01); *C25D 5/12* (2013.01); *H01L 24/05* (2013.01); *H01L 24/27* (2013.01); *H01L 24/33* (2013.01); *H01L 24/84* (2013.01); *C23C 18/36* (2013.01); *C23C 18/54* (2013.01); *H01L 24/32* (2013.01); *H01L 24/40* (2013.01); *H01L 2224/29* (2013.01); *H01L 2224/29339* (2013.01); *H01L 2224/32225* (2013.01); *H01L 2224/40091* (2013.01); *H01L 2224/40225* (2013.01); *H01L 2224/73263* (2013.01); *H01L 2224/8384* (2013.01); *H01L 2224/83203* (2013.01); *H01L 2224/8484* (2013.01); *H01L 2224/84203* (2013.01); *H01L 2924/01013* (2013.01); *H01L 2924/01029* (2013.01); *H01L 2924/01042* (2013.01); *H01L 2924/01047* (2013.01); *H01L 2924/01074* (2013.01); *H01L 2924/01079* (2013.01); *H01L 2924/351* (2013.01)

(58) Field of Classification Search
CPC . H01L 2924/01047; H01L 2924/01079; H01L 2924/0132; H01L 2924/01028; H01L 2924/01082
See application file for complete search history.

(56) References Cited

U.S. PATENT DOCUMENTS

| 2004/0082189 A1* | 4/2004 | Totokawa | H05K 3/125 |
| | | | 438/720 |
| 2006/0267218 A1 | 11/2006 | Hozoji et al. | |
| 2008/0266643 A1* | 10/2008 | Kawamoto | G02F 1/155 |
| | | | 359/275 |

FOREIGN PATENT DOCUMENTS

| JP | 2004-115902 A | 4/2004 |
| JP | 2005-136375 A | 5/2005 |
| JP | 2006-131949 A | 5/2006 |
| JP | 2007-180059 A | 7/2007 |
| JP | 4096671 B2 | 3/2008 |
| JP | 2008-208442 A | 9/2008 |

* cited by examiner

FIG. 4

| | FIRST METAL FILM | | SECOND METAL FILM | | | | Ag PARTICLE BONDING | | SOLDER BONDING | TENSILE STRENGTH |
|---|---|---|---|---|---|---|---|---|---|---|
| | THICKNESS (μm) | P CONCENTRATION (wt%) | METAL | THICKNESS (μm) | PARTICLE SIZE (nm) | | TEMPERATURE (°C) | PRESSURE (MPa) | TEMPERATURE (°C) | |
| FIRST SAMPLE | 5.0 | 7.1 | Ag | 0.1 | 70 | | 250 | 10 | — | 61.1 |
| SECOND SAMPLE | 10 | 6.9 | Ag | 0.5 | 160 | | 350 | 0 | — | 45.5 |
| THIRD SAMPLE | 5.2 | 7.0 | Ag | 0.1 | 70 | | 200 | 5 | — | 41.1 |
| FOURTH SAMPLE | 5.1 | 7.1 | Au | 0.03 | 15 | | 250 | 10 | — | 53.2 |
| FIRST COMPARATIVE EXAMPLE | 0.8 | 7.0 | Ag | × | × | | — | — | — | — |
| SECOND COMPARATIVE EXAMPLE | 4.9 | 9.3 | Ag | × | × | | — | — | — | — |
| THIRD COMPARATIVE EXAMPLE | 4.9 | 2.1 | Ag | 0.1 | 150 | | 250 | 10 | — | 0 |
| FOURTH COMPARATIVE EXAMPLE | 5.2 | 7.0 | Ag | 1.5 | 600 | | 250 | 10 | — | 13.8 |
| FIFTH COMPARATIVE EXAMPLE | 5.0 | 6.9 | Ag | 0.1 | 70 | | 150 | 10 | — | 14.9 |
| SIXTH COMPARATIVE EXAMPLE | 5.0 | 6.9 | Ag | 0.1 | 70 | | 450 | 10 | — | 15.5 |
| SEVENTH COMPARATIVE EXAMPLE | 5.1 | 7.0 | Ag | 0.1 | 70 | | — | — | 280 | 40.5 |

FIG. 10

| TIME (min) | FILM THICKNESS (μm) | PRECIPITATED PARTICLE SIZE (μm) |
|---|---|---|
| 3 | 0.056 | 0.04 |
| 5 | 0.101 | 0.07 |
| 10 | 0.175 | 0.09 |
| 20 | 0.38 | 0.12 |
| 30 | 0.538 | 0.16 |
| 40 | 0.74 | 0.2 |
| 100 | 1.5 | 0.6 |

ELECTRONIC COMPONENT AND METHOD OF MANUFACTURING ELECTRONIC COMPONENT

BACKGROUND OF THE INVENTION

A. Field of the Invention

The present invention relates to an electronic component and to a method of manufacturing an electronic component.

B. Description of the Related Art

Conventionally, a method is commonly known in which a semiconductor apparatus is bonded to a mounting substrate or a package via bumps such as solder. A conventional package structure is described here with reference to FIG. 11. FIG. 11 is a cross-sectional diagram showing a principal part of a semiconductor apparatus with a conventional package structure. FIG. 11 does not depict a case or external electrode terminals. As shown in FIG. 11, a rear surface of semiconductor chip 101 including a semiconductor element is bonded to circuit pattern section 104 of a front surface of insulating substrate 103, via solder bonding layer 102.

The rear surface of insulating substrate 103 is bonded to a front surface of metal plate 105 which is made of copper (Cu), for example (called a "Cu plate" below). The rear surface of Cu plate 105 is bonded to a front surface of the base member 106 via a solder bonding layer (not illustrated). Electrodes (not illustrated) which are provided on the front surface of semiconductor chip 1 (called "front surface electrodes" below) are connected to metal plate 107 via solder bonding layer 108, and are electrically connected to circuit pattern section 104 by metal plate 107.

The front surface electrodes of the semiconductor elements are made from Cu or aluminum (Al), or an alloy of these, for example. However, the solder wetting properties of Cu electrodes deteriorate due to surface oxidation. Moreover, Al electrodes have poor solder wetting properties and cannot make secure close contact with solder. Therefore, in order to bond solder bumps to the element electrodes, it is necessary to form an under-bump metal film.

This under-bump metal film is created by applying plating, such as electroless Ni/Au plating (ENIG), immersion Sn plating (ISn), immersion Ag plating (IAg), or the like, to the surface of a conducting section which is to form front surface electrodes of the semiconductor apparatus, for instance. Electroless Ni/Au plating, for example, involves sequentially forming an electroless nickel-phosphorus (NiP) alloy film and a gold (Au) film. By applying a plating film having a composition of this kind to the surface of the conducting section which is made from a conductive material such as Cu or Al, the materials which constitute the conducting section are prevented from spreading into the solder and becoming lost. Moreover, decline of solder wetting properties is prevented by oxidation of the nickel (Ni) film, and the solder wetting properties are improved.

One method proposed as a method for applying a plating such as that described above is a method which involves continuously carrying out a step of bringing the plating receiving material into contact with an electroless metal plating solution from which Au ions have been removed, and a step of bringing the plating receiving material into contact with an electroless metal plating solution including Au ions (see, for example, Japanese Patent Publication No. 3484367).

Furthermore, to propose a further method, there is an electronic component plating method in which a plating process is applied to a conducting section formed on a front surface of a substrate material, an electroless Ni film having Ni as a main component and an immersion Au film having Au as a main component are formed successively, and post-processing is then carried out to remove the Ni compound to which the immersion Au film is adhering, wherein the Ni removing solution used is a specified complexing agent selected from citric acid, glycerine, acetic acid, gluconic acid, glutaminic acid, tartaric acid, ethylene diamine tetraacetic acid, diethylene triamine pentaacectic acid, malic acid, malonic acid, sulfurous acid, ammonia and sulfaminic acid, and the post-processing implements a contact process by bringing the Ni compound into contact with the Ni removal solution, thereby removing the Ni compound from the immersion Au film (see, for example, Japanese Patent Publication No. 4096671).

The following method has been proposed as yet another technique. An Ni—P film having a two-layer structure is formed on a conducting portion formed on the front surface of a ceramic material, and an Au film is also formed on the front surface of the Ni—P film. In the Ni—P film, the first layer has a phosphorus (P) content of no less than 3 wt % and no more than 6 wt %, and the second layer has a P content exceeding 6 wt % and no more than 9 wt %, the thickness thereof being no less than 0.1 μm and no more than 1.0 μm (see, for example, Japanese Patent Application Publication No. 2006-131949).

In another method, by carrying out a pre-treatment step, a self-catalyzing Ni plating step and an immersion Au plating step, an Ni—P film and an Au film are formed successively on top of a Cu electrode formed on the surface of a ceramic material. In a post-processing step, the ceramic material on which an Au film has been formed is taken as an object for drying, the object for drying is supplied to a vacuum drying apparatus which has been reduced to a pressure of at least 13.3 Pa or lower, a vacuum drying process is carried out, and the water remaining on the interface between the Ni—P film and the Au film is removed. Instead of an Au film, it is also possible to use a metal having a lower ionization tendency than Ni, and more specifically, Ag, Cu, palladium (Pd) or platinum (Pt), or an alloy of these (see, for example, Japanese Patent Application Publication No. 2004-115902).

The following method has been proposed as yet a further method. Using connection electrodes obtained by applying Ni plating to a copper plate and then carrying out further Au plating on the surface thereof, a semiconductor element is mounted on the wiring of an insulating substrate, and a solution containing Au particles having an average particle diameter of 5 nm is applied to the emitter electrodes (upper side) of the semiconductor element. Furthermore, a Ni plating process is applied to the surface of the copper wiring pattern formed on the insulating substrate, and a solution containing Au particles is applied to the Au plating portions of the wiring which have undergone an Au plating process, in the portions which are connected with the emitter electrodes of the semiconductor element via the terminals. After drying the solution containing Au which has been applied to the semiconductor element and the wires on the insulating substrate and forming an electrode portion made from gold particles, the connection terminals are mounted on the upper portion of the electrodes which are made of gold particles, and heated to approximately 80° C. for 60 minutes, thereby connecting the semiconductor element and the wires (see, for example, Japanese Patent Application Publication No. 2005-136375).

The following method has been proposed as yet a further method. When a semiconductor element is mounted on a lead frame, a plating film of Ag or Ag alloy is applied to the bonding region between the semiconductor element and the lead frame, and a conductive adhesive containing nanoparticles is used as the bonding material for mounting. The conductive adhesive is based on a thermo-curable resin, such as epoxy, which is mixed with silver particles having a particle diameter of 1 to 20 μm and silver particles having a diameter no greater than 20 nm (see, for example, Japanese Patent Application Publication No. 2007-180059).

The following method has been proposed as yet a further method. The method involves performing: a step of forming an oxide layer containing oxygen on a bonding interface of a member to be bonded, a step of arranging a bonding material containing metal compound particles having an average particle diameter of no less than 1 nm and no more than 50 μm, and a reducing agent made of an organic material, on the bonding interface, and a step of bonding the member to be bonded by heating and pressurizing the member to be bonded. After previously precipitating copper, silver or nickel by electroless plating or electroplating, before bonding, onto the bonding surface of the member to be bonded, processing is carried out to oxidize the surface of the plating metal (see, for example, Japanese Patent Application Publication No. 2008-208442).

Conventionally, when bonding a semiconductor apparatus and a mounting substrate, or bonding a semiconductor apparatus and a package, the bonding material used is a solder having a reflow resistance of approximately 260° C. and containing a large amount of lead (Pb) which imparts little thermal stress (this solder is called "high-lead-content solder" below). However, lead is a material which is harmful to the environment, and the use of lead is restricted in many countries by chemical substance regulations, such as the RoHS Directive. At the present time, high-lead-content solder is excluded, exceptionally, from the materials which are prohibited from use, but there is a need for rapid change towards materials which do not contain lead (called "lead-free materials" below).

Conventionally known examples of lead-free materials which are alternatives to high-lead-content solder include, for instance, zinc (Zn) solder, Sn—Ag solder, tin-antimony (Sn—Sb) high-temperature solder, and a resin adhesive type of high-conductivity silver paste, and recently the use of a silver particle bonding material, and the like, has been proposed.

Japanese Patent Application Publication No. 2008-208442 proposes a method in which, as a bonding method instead of soldering, bonding of high thermal resistance, high reliability and high heat radiation properties is made possible by bonding together metal surfaces formed by electroless plating or electroplating using a bonding material consisting of silver particles of which the surfaces are coated with organic material, such as a silver nano-particle bonding material. By this means, it is possible to achieve a lower bonding temperature in the bonding step during the mounting process.

However, as a result of repeated thorough research by the present inventors, the following problems were newly discovered. In the technology shown in Japanese Patent Publication Nos. 3484367 and 4096671, and Japanese Patent Application Publication Nos. 2006-131949, 2004-115902, and 2005-136375, when an Sn—Ag type solder which does not contain lead (called lead-free solder) is used as a solder, the solder has low thermal resistance, and due to the compactification of electronic components in recent years, the solder is not able to withstand harsh mounting conditions which involve an increased number of reflows during component mounting or a raised reflow temperature, for instance. Furthermore, if a Sn—Sb type of high-temperature solder is used, since the solder itself is hard, there is a problem in that the chip itself is liable to fracture during the cooling step, or the like.

Moreover, in the technology described in Japanese Patent Application Publication Nos. 2007-180059 and 2008-208442, it is proposed that a high bonding strength be obtained by bonding together silver nano-particle bonding material and plating metal as a lead-free bonding material, but the bonding strength between the silver nano-particle bonding material and the plating metal is greatly dependent on the type and film thickness of plating metal on the bonding surface and the state of the precipitated particles. Therefore, this technology is not sufficient to achieve a secure bonding strength.

The present invention is directed to overcoming or at least reducing the effects of one or more of the problems set forth above.

SUMMARY OF THE INVENTION

The present invention resolves problems due to the prior art described above, and provides an electronic component and a method of manufacturing an electronic component having high bonding strength. Furthermore, the present invention provides an electronic component and a method of manufacturing an electronic component having high thermal resistance. Moreover, the present invention provides an electronic component and a method of manufacturing an electronic component having high heat radiation properties.

In view of the problems described above, the electronic component according to this invention has the following characteristic features. A conducting section is provided on a surface of a semiconductor element. A first metal film is provided on a surface of the conducting section. A second metal film is provided on a surface of the first metal film. A bonding layer containing silver particles is provided on a surface of the second metal film. The thickness of the second metal film is no less than 0.03 μm and less than 1.5 μm.

In one embodiment, the electronic component relating to this invention is the electronic component described above, wherein the second metal film is composed of particles having a diameter no less than 15 nm and less than 600 nm.

In one embodiment, the electronic component relating to this invention is the electronic component described above, wherein the second metal film is made from a material having at least silver or gold as a main component.

In one embodiment, the electronic component relating to this invention is the electronic component described above, wherein the second metal film is an electroplating film or an electroless plating film.

In one embodiment, the electronic component relating to this invention is the electronic component described above, wherein the conducting section is made from a material having at least copper or aluminum as a main component.

In one embodiment, the electronic component relating to this invention is the electronic component described above, wherein the first metal film is made from a material having nickel and phosphorus as main components.

In one embodiment, the electronic component relating to this invention is the electronic component described above, wherein the first metal film is made from nickel-phosphorus, nickel-phosphorus-tungsten or nickel-phosphorus-molybdenum.

In one embodiment, the electronic component relating to this invention is the electronic component described above, wherein the phosphorus content in the first metal film is greater than 2.1 wt % and less than 9.3 wt %.

In one embodiment, the electronic component relating to this invention is the electronic component described above, wherein the thickness of the first metal film is greater than 0.8 μm and no greater than 10 μm.

In one embodiment, the electronic component relating to this invention is the electronic component described above, wherein the first metal film is an electroplating film or an electroless plating film.

In one embodiment, the electronic component relating to this invention is the electronic component described above, wherein the bonding layer is a sintered body formed by heating at a temperature higher than 150° C. and less than 450° C., with or without application of pressure.

In one embodiment, in view of the problems described above, a method of manufacturing an electronic component according to this invention has the following characteristic features. Firstly, a step of forming a first metal film on a surface of a conducting section provided on a surface of the semiconductor wafer is performed. Then, a step of forming a second metal film to a thickness of no less than 0.03 μm and less than 1.5 μm on a surface of the first metal film is performed. Next, a step of applying a conductive material containing silver particles to a surface of the second metal film is performed. Thereupon, a step of sintering the conductive material by heat treatment is performed.

In one embodiment, the method of manufacturing an electronic component relating to this invention is the method described above, wherein the second metal film is composed of particles having a diameter no less than 15 nm and less than 600 nm.

In one embodiment, the method of manufacturing an electronic component relating to this invention is the method described above, wherein the second metal film is formed by immersing the semiconductor wafer on which the first metal film has been formed, in a solution containing a metal having a lower ionization tendency than the first metal film, or a solution containing a material which promotes precipitation of metal on the surface of the first metal film.

In one embodiment, the method of manufacturing an electronic component relating to this invention is the method described above, wherein the second metal film is formed by an electroless plating process.

In one embodiment, the method of manufacturing an electronic component relating to this invention is the method described above, wherein the second metal film is formed by an electroplating process.

In one embodiment, the method of manufacturing an electronic component relating to this invention is the method described above, wherein the second metal film is formed from a material having at least silver or gold as a main component.

In one embodiment, the method of manufacturing an electronic component relating to this invention is the method described above, wherein the conducting section is formed from a material having at least copper or aluminum as a main component.

In one embodiment, the method of manufacturing an electronic component relating to this invention is the method described above, wherein the first metal film is formed from a material having nickel and phosphorus as main components.

In one embodiment, the method of manufacturing an electronic component relating to this invention is the method described above, wherein the first metal film is formed from nickel-phosphorus, nickel-phosphorus-tungsten or nickel-phosphorus-molybdenum.

In one embodiment, the method of manufacturing an electronic component relating to this invention is the method described above, wherein the first metal film is formed with a phosphorus content greater than 2.1 wt % and less than 9.3 wt %.

In one embodiment, the method of manufacturing an electronic component relating to this invention is the method described above, wherein the first metal film is formed to a thickness greater than 0.8 μm and no greater than 10 μm.

In one embodiment, the method of manufacturing an electronic component relating to this invention is the method described above, wherein the first metal film is formed by an electroplating process or an electroless plating process.

In one embodiment, the method of manufacturing an electronic component relating to this invention is the method described above, wherein, in the heat treatment, the conductive material is sintered by heating at a temperature higher than 150° C. and less than 450° C.

In one embodiment, the method of manufacturing an electronic component relating to this invention is the method described above, wherein, in the heat treatment, the conductive material is sintered by applying pressure while heating at a temperature higher than 150° C. and less than 450° C.

According to the invention described above, by stacking a first metal film and a second metal film onto a conducting section provided on a semiconductor chip and bonding a metal plate onto the surface of the second metal film via a bonding layer containing Ag particles, it is possible to raise the bonding strength in comparison with a case where the second metal film and the metal plate are bonded by a solder bonding layer.

Furthermore, in the step of forming a first metal film, a first metal film having good adhesion with the second metal film can be formed. Therefore, in the step of forming a second metal film, particles which constitute a second metal film can be precipitated readily onto the surface of the first metal film. Therefore, it is possible to form a second metal film having a thickness and precipitated particle size within the range stated above. Furthermore, it is also possible to form a second metal film having good adhesion with the bonding layer containing Ag particles. Consequently, the connection strength between the second metal film and the bonding layer containing Ag particles can be made equal to or higher than when bonding by solder bonding (see FIG. 11).

According to the electronic component and the method of manufacturing an electronic component of the present invention, a beneficial effect is obtained in that an electronic component having high bonding strength can be provided. Furthermore, according to the electronic component and the method of manufacturing an electronic component of the present invention, a beneficial effect is obtained in that an electronic component having high thermal resistance can be provided. Moreover, according to the electronic component and the method of manufacturing an electronic component of the present invention, a beneficial effect is obtained in that an electronic component having high heat radiation properties can be provided.

BRIEF DESCRIPTION OF THE DRAWINGS

The foregoing advantages and features of the invention will become apparent upon reference to the following detailed description and the accompanying drawings, of which:

FIG. 4 is a chart showing the bonding strength of the electronic component according to the present embodiment;

FIG. 10 is a chart showing a relationship between the metal film which constitutes an electronic component according to the present embodiment and the plating time.

DETAILED DESCRIPTION OF SPECIFIC EMBODIMENTS

Figure 1:
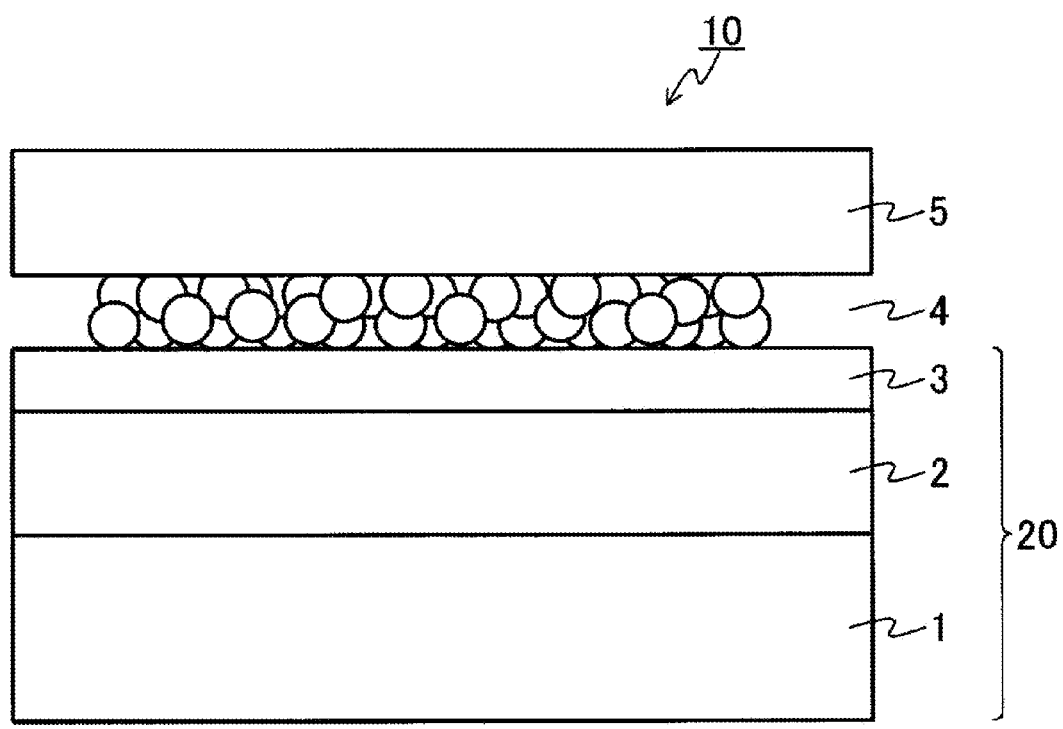
FIG. 1 is a cross-sectional diagram showing a principal part of an electronic component according to an embodiment of the invention.

Below, preferred embodiments of an electronic component and a method of manufacturing an electronic component relating to this invention will be described in detail with reference to the accompanying drawings. In the description of the embodiments and the accompanying drawings given below, similar parts of the composition are labeled with the same reference numerals, and duplicated description thereof is omitted.

Embodiments

FIG. 1 is a cross-sectional diagram showing a principal part of an electronic component relating to an embodiment of the invention. Electronic component 10 shown in FIG. 1 is depicted in relation to the bonding section between semiconductor chip 20 having a semiconductor element, and metal plate 5. A first metal film 2 is provided on a surface of conducting section (front surface electrode, or the like) 1 which is provided on the front surface of semiconductor chip 20. Second metal film 3 is provided on the surface of first metal film 2. Bonding layer 4 containing silver (Ag) particles is provided on a surface of second metal film 3. Bonding layer 4 containing Ag particles is a sintered body of a conductive composition which contains Ag particles (conductive material). Semiconductor chip 20 is bonded to metal plate 5 via bonding layer 4, and is electrically connected to other members, which are not depicted.

Desirably, conducting section 1 is made of copper (Cu), aluminum (Al), or an alloy of these. Desirably, conducting section 1 employs an Al alloy consisting, for example, of Al and Cu, silicon (Si), Ni, magnesium (Mg) or zinc (Zn), etc.

Furthermore, for conducting section 1, it is possible to use a 1000 type to 7000 type Al alloy, for example. More specifically, desirably, an Al—Si alloy or an Al—Si—Cu alloy is deposited by a sputtering process as conducting section 1, for example. The film thickness of conducting section 1 is desirably no less than 1 µm and no more than 10 µm.

First metal film 2 may be a material, such as a Ni alloy plating film, which can cause precipitate particles that are to form second metal film 3 to be precipitated onto the front surface of first metal film 2, in the plating process for forming second metal film 3. Desirably, first metal film 2 is a nickel-phosphorus (NiP) alloy plating film, for example. More specifically, first metal film 2 may be an NiP alloy plating film such as nickel-phosphorus-tungsten (NiPW), nickel-phosphorus-molybdenum (NiPMo), or the like, or an Ni alloy plating film such as nickel-boron (NiB), or the like. Desirably, the thickness of first metal film 2 is greater than 0.8 µm and no more than 10 µm. If first metal film 2 is an NiP alloy plating film, then the P content of the NiP alloy plating film is desirably greater than 2.1 wt % and less than 9.3 wt %. Consequently, the precipitate particles constituting second metal film 3 are readily precipitated in the dimensions indicated hereinafter, on the surface of first metal film 2.

Second metal film 3 is constituted by precipitated particles which have been precipitated onto the surface of first metal film 2 by a plating process. Second metal film 3 may be a metal film which is formed by an electroplating process, or a metal film which is formed by an electroless plating process. Furthermore, if second metal film 3 is a metal film formed by an electroless plating process, for example, then second metal film 3 may be composed of particles precipitated from metal in a plating bath containing metal which has a lower ionization tendency than first metal film 2 (immersion plating bath), or in a plating bath containing a substance which promotes precipitation of metal onto the surface of first metal film 2 (reduced plating bath).

Second metal film 3 may be an Ag plating film or an Au plating film. Desirably, the thickness of second metal film 3 is no less than 0.03 µm and is less than 1.5 µm. Desirably, the diameter of the precipitated particles which are precipitated by the plating process for forming second metal film 3 and which constitute second metal film 3 (the particle diameter, called "precipitated particle size" below) is no less than 15 nm and less than 600 nm. By setting the thickness of second metal film 3 and the precipitated particle size to the dimensions stated above, it is possible to raise the bonding strength between second metal film 3 and bonding layer 4 which contains Ag particles. More specifically, second metal film 3 has a thickness which is directly proportional to the precipitated particle size. For example, if a plating process for forming second metal film 3 is carried out for 5 minutes, precipitated particles having a particle size of 0.07 µm are precipitated and a second metal film 3 having a thickness of 0.1 µm is formed. The detailed conditions of bonding layer 4 containing Ag particles are described below.

Figure 2:
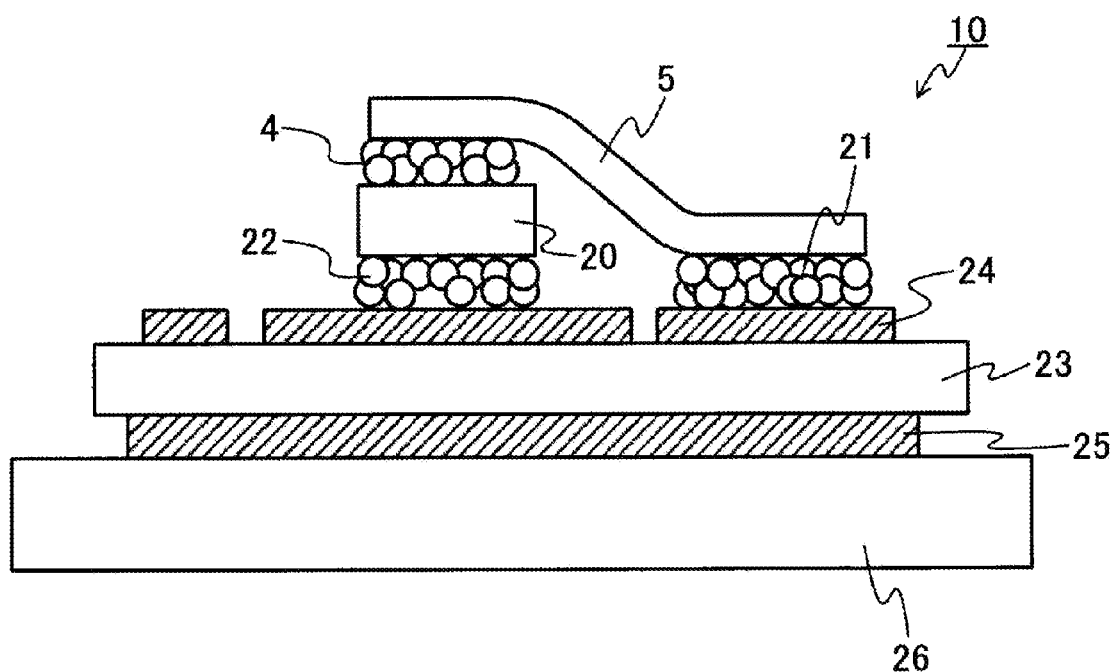
FIG. 2 is a cross-sectional diagram showing a principal part of a semiconductor apparatus having a package structure.

Next, a semiconductor apparatus having a package structure which is manufactured by using electronic component 10 shown in FIG. 1 will be described. FIG. 2 is a cross-sectional diagram showing a principal part of a semiconductor apparatus having a package structure. A front surface electrode (conducting section 1 shown in FIG. 1), which is not illustrated, is provided on the surface of semiconductor chip 20. In order to ensure a secure bonding strength between this front surface electrode and metal plate 5, first metal film 2 and second metal film 3 are deposited by an electroless plating method, for example (see FIG. 1).

An Au film or an Ag film is deposited onto the uppermost surface of metal plate 5. One end of metal plate 5 is bonded to circuit pattern section 24 via bonding layer 21 containing Ag particles. The other end of metal plate 5 is bonded to a front surface electrode of semiconductor chip 20 via bonding layer 4 containing Ag particles. Circuit pattern section 24 on the surface of insulating substrate 23 and the front surface electrode of semiconductor chip 20 are electrically connected by metal plate 5.

A rear surface electrode (not illustrated) is provided on a rear surface of semiconductor chip 20. An Au film or an Ag film is deposited by sputtering, for example, onto this rear surface electrode. The rear surface electrode of semiconductor chip 20 is bonded to circuit pattern section 24 provided on the front surface of insulating substrate 23, which is a supporting substrate, via bonding layer 22 containing Ag particles. An Au film or an Ag film is deposited onto the outermost surface of circuit pattern section 24.

The rear surface of insulating substrate 23 is bonded to the front surface of metal plate (Cu plate) 25 which is made of copper. The rear surface of Cu plate 25 is bonded to the front surface of base member 26. The bonding of insulating substrate 23 and Cu plate 25 and the bonding of Cu plate 25 and base member 26 can be performed via a bonding layer (not illustrated) containing Ag particles, for example. An Au film or an Ag film, for example, is deposited on the outermost surface of Cu plate 25. Base member 26 is made of a material having high conductivity.

Figure 3:
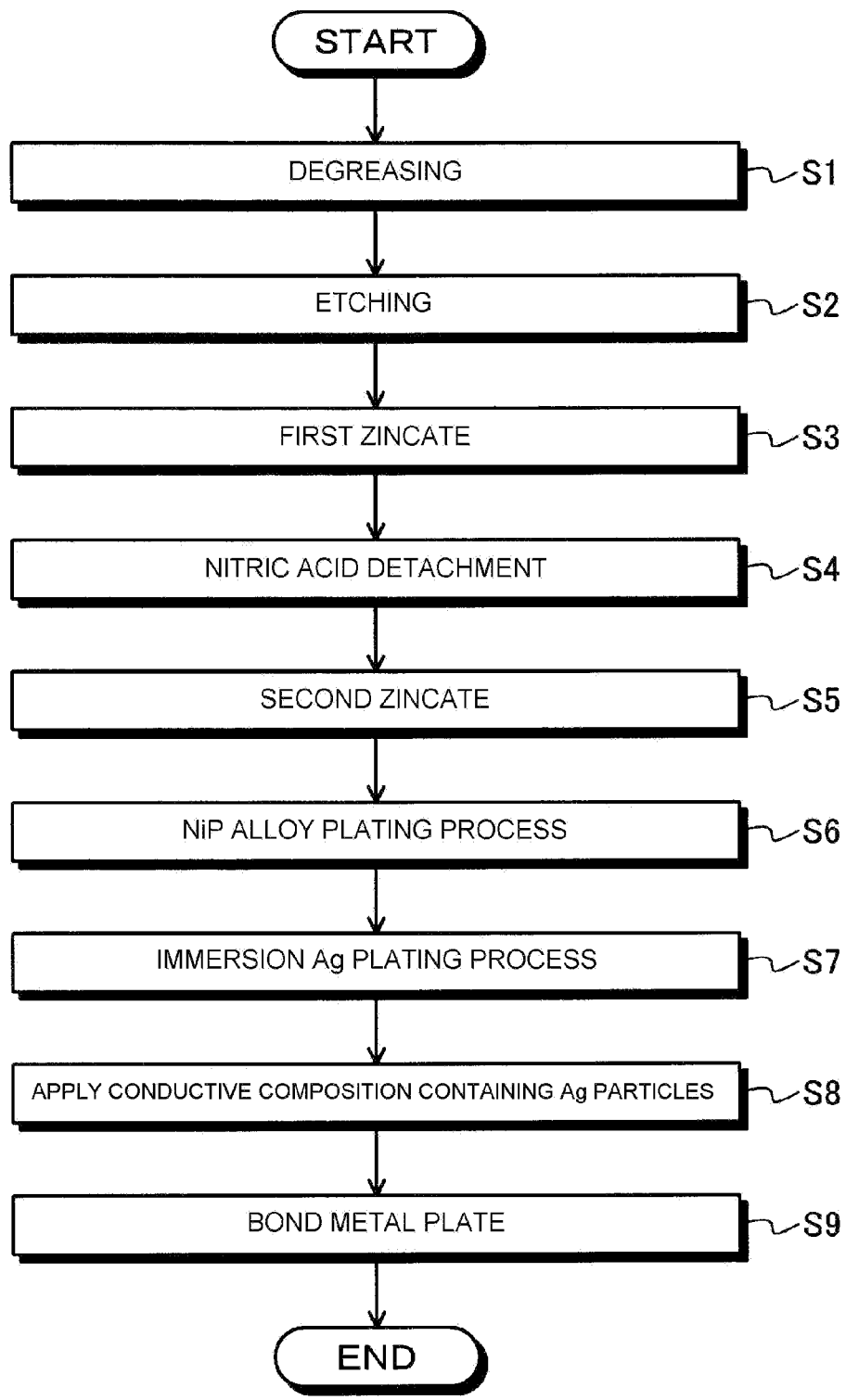
FIG. 3 is a flowchart showing a method of manufacturing an electronic component according to the present embodiment.

Next, a method of manufacturing electronic component 10 shown in FIG. 1 will be described. FIG. 3 is a flowchart showing a method of manufacturing an electronic component relating to an embodiment of the invention. In manufacturing electronic component 10, the plating pre-processing shown in steps S1 to S5 is carried out before carrying out the plating process (step S6) on the front surface of conducting section 1 which is provided on the semiconductor wafer. After carrying out the plating process (steps S6, S7), the semiconductor wafer is diced and cut into semiconductor chips 20. Metal plate 5 is then bonded via bonding layer 4 containing Ag particles onto the surface of the plating film which is provided on the front surface of semiconductor chip 20 (steps S8, S9).

More specifically, as shown in FIG. 3, in the plating pre-processing, firstly, a degreasing process is applied to the semiconductor wafer (step S1). Thereupon, particles, organic material and oxide film adhering to the surface of the semiconductor wafer are removed by etching (step S2). After the processing in step 2, the semiconductor wafer may receive an acid wash using nitric acid, for example, to remove insoluble etching residue which occurs on the surface of the semiconductor wafer due to the processing in step 2.

Next, a zincate (zinc immersion) process (first zincate process) is carried out to improve the adhesion of the front surface of the semiconductor wafer with respect to first metal film 2 deposited by the subsequent step (step S3). Thereupon, the semiconductor wafer receives an acid wash using nitric acid, for example, to remove the immersion zinc layer formed on the front surface of the semiconductor wafer in step S3 (nitric acid detachment, step S4). Next, a zincate process is carried out again (second zincate process) to improve the adhesion of the front surface of the semiconductor wafer with respect to first metal film 2 which is to be deposited by the subsequent step, thereby completing the plating pre-processing (step S5). Processes for washing the surface of conducting section 1 are carried out respectively between the processes in steps S1 to S5. Thereupon, the semiconductor wafer is diced and cut up into individual semiconductor chips 20.

The NiP alloy plating process is carried out after the plating pre-processing of this kind, and an NiP alloy plating film, for example, is formed as first metal film 2 on the surface of conducting section 1 (step S6). More specifically, in step S6, for example, semiconductor chip 20 on which conducting section 1 has been formed is fixed in a jig, and is introduced while rotating into an electroless plating bath having NiP as a main component. Here, the processing conditions of the electroless plating process are, desirably, a bath temperature of no less than 70° C. and no more than 95° C. and a pH of no less than pH 4 and no more than pH 5.

The thickness of the plating film is dependent on the temperature of the electroless plating bath, the pH and the plating time. In step S6, for example, the plating time is set to no less than 5 minutes and no more than 60 minutes. Consequently, it is possible to set the NiP alloy plating film to a thickness greater than 0.8 μm and no more than 10 μm, and to set the P content in the NiP alloy plating film to more than 2.1 wt % and less than 9.3 wt %. Here, a case where an NiP alloy plating film is formed is described by way of example, but it is also possible to adopt the same method to form the other NiP alloy described above as first metal film 2.

Next, after washing semiconductor chip 20, an immersion Ag plating process is carried out, and a Ag plating film is formed, for example, as second metal film 3 on the surface of first metal film 2 (step S7). If second metal film 3 is formed by an immersion Ag plating process in step S7, then semiconductor chip 20 on which first metal film 2 has been formed is immersed in a plating bath containing metal having a lower ionization tendency than first metal film 2. For example, semiconductor chip 20 on which an NiP alloy plating film has been deposited as first metal film 2 is fixed by a jig, and is introduced while rotating into an electroless plating path having Ag as a main component. First metal film 2 which is made of a material having a higher ionization tendency than the metal in the plating bath dissolves into the plating bath. The Ag ions in the plating bath accept electrons from first metal film 2 which has melted into the plating bath, form Ag particles and precipitate onto the surface of first metal film 2. Consequently, second metal film 3 formed by the precipitated Ag particles is formed on the surface of first metal film 2. Here, the processing conditions of the electroless plating process are, desirably, a bath temperature no less than 20° C. and no more than 50° C. and no more than pH 1.

The thickness of the plating film and the precipitate particle size of the plating film have a directly proportional relationship, as described above, and are dependent on the bath temperature and the plating time. In step S7, for example, if the temperature of the plating bath is set to 25° C., the plating time should be set to no less than 1 minute and no more than 30 minutes, and if the temperature of the plating bath is set to 50° C., the plating time should be set to no less than 30 seconds and no more than 5 minutes. Accordingly, it is possible to set the size of the precipitated particles in the Ag plating film to be no less than 15 nm and to be less than 600 nm, and it is possible to set the thickness of the Ag plating film to be no less than 0.03 μm and to be less than 1.5 μm. Here, a case where an Ag plating film is formed is described by way of example, but it is also possible to use a similar method to form an Au plating film as second metal film 3.

After the processing in step S7, in order to improve the corrosion resistance of the Ag plating film, it is also possible to carry out a process of immersing semiconductor chip 20 in a discoloration inhibiting agent (called "discoloration inhibiting processing" below). For the discoloration inhibiting agent, it is possible to use a solution containing, for example, benzotriazle, 2-mercapto benzothiazol, thiophenol, lauryl mercaptone, thionaphthol, thioanthranol, or the like.

Next, a conductive composition in the form of a paste containing Ag particles is applied to the surface of second metal film 3 (step S8). Thereupon, after placing metal plate 5 on the surface of the conductive composition in the form of a paste containing Ag particles, the conductive composition is heated, or heated and pressurized, thereby sintering the conductive composition containing Ag particles and forming bonding layer 4 containing Ag particles, which bonds metal plate 5 to the surface of second metal film 3 (step S9). Thereby, an electronic component 10 is completed.

In step S7, provided that second metal film 3 can be formed to a film thickness and a precipitated particle size in the ranges described above, it is possible to carry out a reductive Ag plating process instead of the immersion Ag plating process, for example. If second metal film 3 is formed by a reductive Ag plating process, then semiconductor chip 20 on which first metal film 2 has been formed is immersed in a plating bath containing a substance (reducing agent) which promotes precipitation of metal on the surface of first metal film 2. The Ag ions in the plating bath accept electrons from the reducing agent dissolved in the plating bath and form Ag particles which are precipitated onto the surface of first metal film 2.

In step S8, for the conductive composition in the form of a paste which contains Ag particles, it is suitable to use a material consisting of a mixture including one or more substance from among an Ag compound, a carboxylic acid, an amine and an alcohol, which contains any selected solvent. Furthermore, the conductive composition in the form of a paste containing Ag particles should be a material which can yield metal bonds by breaking down the organic material through heating and sintering the Ag particles.

Here, the Ag compound may be silver (I) oxide, silver (II) oxide, silver acetate, silver nitrate, silver benzoate, silver bromate, silver bromide, silver carbonate, silver chloride, silver citrate, silver fluoride, silver iodate, silver iodide, silver lactate, silver nitrate, silver perchlorate, silver phosphate, silver sulphate, silver sulfide, and the like.

As a compound containing carboxylic acid, it is possible to use an alkyl carboxylic acid. More specific examples are: butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, nanodecanoic acid, or eicosanoic acid. Furthermore, the carboxylic acid is not limited to a primary carboxylic acid, and it is also possible to use a secondary carboxylic acid, a tertiary carboxylic acid, a dicarboxylic acid, or a carboxylic compound having a ring structure.

It is possible to use an alkyl amine as a compound containing an amino group. More specifically, for example, it is possible to use butyl amine, pentyl amine, hexyl amine, heptyl amine, octyl amine, nonyl amine, decyl amine, undecyl amine, dodecyl amine, tridecyl amine, tetradecyl amine, pentadecyl amine, hexadecyl amine, heptadecyl amine, octadecyl amine, nonadecyl amine, or eicodecyl amine. Moreover, the compound having an amino group may have a branched structure. Furthermore, the alkyl amine is not limited to a primary amine, and may also be a secondary amine or a tertiary amine.

It is possible to use an alkyl alcohol as a compound containing a hydroxy group. More specifically, for example, it is possible to use ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol or eicosyl alcohol. Moreover, the alkyl alcohol is not limited to a primary alcohol and it is also possible to use a secondary alcohol, such as ethylene glycol, a tertiary alcohol such as triethylene glycol, an alkane diol, or an alcohol compound having a ring structure. Furthermore, it is also possible to use a compound having four hydroxy groups, such as citric acid, ascorbic acid, or the like.

For the solvent which is contained in the conductive composition in the form of a paste containing Ag particles, if the conductive composition is used directly after being generated, it is possible to use methanol, ethanol, propanol, ethylene glycol, triethylene glycol, terpineol, tenpineol, or the like. If the conductive composition is stored for a prolonged time after generation, it is desirable to use a material which has a weak reducing action at normal temperature, such as water, hexane, tetahydrofuran, toluene, cyclohexane, miristyl alcohol, or the like.

The combination of the Ag compound and the organic material described above should be a combination of materials which can precipitate Ag particles when mixed together. Desirably, from the viewpoint of the storage properties of the bonding material, it is suitable to use a combination which does not generate Ag particles at normal temperature.

For the method of applying the conductive composition in the form of a paste containing Ag particles, it is possible to employ a method which applies the conductive composition only to the surface of conducting section 1 by spraying a conductive component in the form of a paste from a fine nozzle by an inkjet method, a method which applies a conductive composition only to the surface of conducting section 1 by using a metal mask having an opening section which exposes the surface of conducting section 1 or by using a mesh-shaped mask, or a method which applies a conductive composition only to the surface of conducting section 1 by using a dispenser.

The processing conditions when bonding second metal film 3 formed on the front surface of semiconductor chip 20 and metal plate 5 should be such that bonding is performed, with or without applying pressure, while heating at a temperature greater than 150° C. and less than 450° C. More specifically, it is desirable to heat at a temperature of 200° C. to 350° C. Moreover, desirably, pressure is applied to a pressure of no less than 0.25 MPa and no more than 10 MPa. Consequently, the conductive composition in the form of a paste which contains Ag particles is sintered and bonding layer 4 containing Ag particles having high bonding strength, excellent thermal resistance and heat radiation properties can be formed.

Furthermore, it is also possible to form a palladium (Pd) layer between first metal film 2 and second metal film 3. This is because it is possible to improve the adhesion between first metal film 2 and second metal film 3 by the Pd layer provided between first metal film 2 and second metal film 3. In this case, after depositing a Pd layer by a plating process on the surface of first metal film 2, it is possible to laminate first metal film 2, the Pd layer and second metal film 3, sequentially, by depositing a second metal film 3 on the surface of the Pd layer, by the plating process described above.

As described above, according to the present embodiment, first metal film 2 and second metal film 3 having the conditions described above are stacked onto conducting section 1 which is provided on top of semiconductor chip 20, and metal plate 5 is bonded to the surface of second metal film 3 via bonding layer 4 containing the Ag particles. Consequently, it is possible to form an electronic component 10 having a higher bonding strength than in the prior art.

Figure 11:
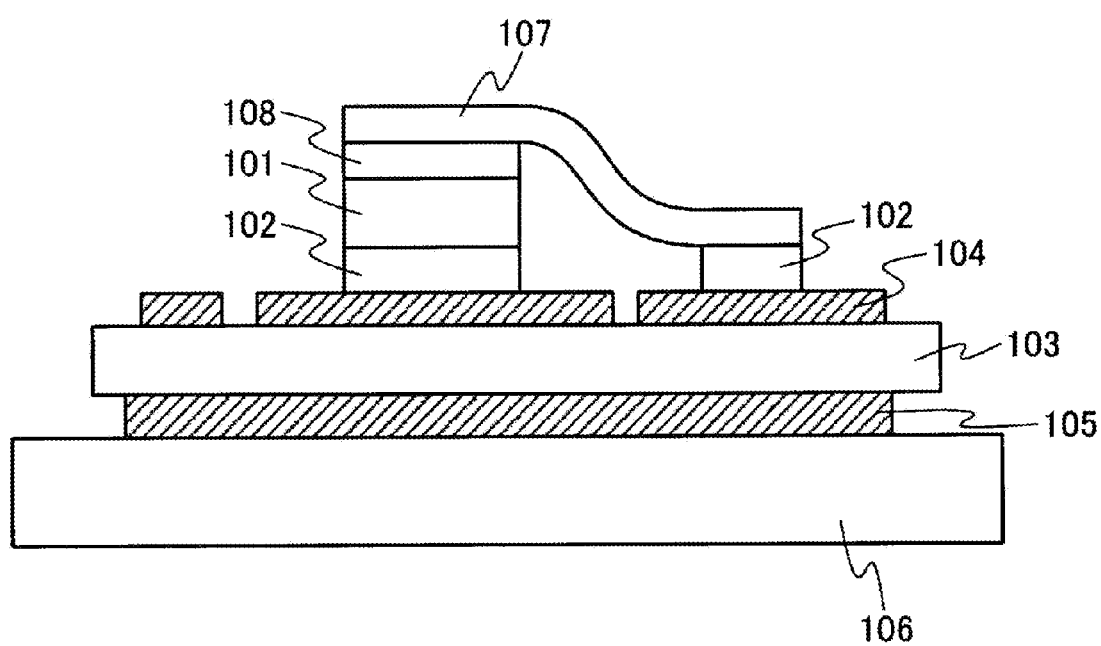
FIG. 11 is a cross-sectional diagram showing a principal part of a conventional semiconductor apparatus having a package structure.

Furthermore, by forming first metal film 2 under the conditions described above, it is possible to form a first metal film 2 which has good tight contact properties with second metal film 3. Therefore, in the immersion Ag plating process for forming second metal film 3, it is possible to make the Ag particles precipitate more readily onto the surface of first metal film 2. Consequently, it is possible to form a second metal film 3 having a film thickness and a precipitated particle size in the ranges stated above. Furthermore, it is possible to form a second metal film 3 having good adhesion with bonding layer 4 containing Ag particles. Therefore, the connection strength between second metal film 3 and bonding layer 4 containing Ag particles can be made equal to or greater than when solder bonding is used (see FIG. 11).

Furthermore, by bonding second metal film 3 and metal plate 5 via bonding layer 4 which contains Ag particles, it is possible to manufacture an electronic component 10 having properties such as a high meting point (approximately 960° C.) of bonding layer 4 containing Ag particles, thermal conductivity of no less than 100 W/m·K and no more than 300 W/m·K, and electrical resistance of no less than 1 μΩcm and no more than 3 μΩcm. Consequently, it is possible to manufacture an electronic component 10 having a high thermal resistance and high heat radiation properties.

First Example

Next, the bonding strength of second metal film 3 and bonding layer 4 containing Ag particles was investigated. FIG. 4 is a chart showing the bonding strength of the electronic component relating to the present invention. A "—" symbol in FIG. 4 indicates that the process shown in that column is not carried out. According to the embodiment, four electronic components 10 (called the "first to fourth samples" below) were manufactured by forming first metal film 2 and second metal film 3 on a front surface of semiconductor chip 20 and bonding metal plate 5 to the surface of second metal film 3 via bonding layer 4 containing Ag particles, using various different electroless plating processing conditions and various different heating and pressurization conditions during bonding.

In the first to fourth samples, an NiP alloy plating film was formed as first metal film 2. An Ag plating film or an Au plating film was formed as second metal film 3. The thickness of first metal film 2 and second metal film 3, the precipitated particle size of second metal film 3, and the P concentration in the NiP alloy plating film were measured. Second metal film 3 and metal plate 5 were then bonded via bonding layer 4 containing Ag particles, and the bonding strength between second metal film 3 and bonding layer 4 containing Ag particles was investigated.

For comparison purposes, seven electronic components (called first to seventh comparative examples below) were manufactured using different electroless plating process conditions and different heating and pressurization conditions during bonding, compared to the first to fourth samples. The composition of the first to seventh comparative examples apart from this was the same as the first to fourth samples. The detailed manufacturing methods of the first to fourth samples and the first to seventh comparative examples are described below.

The thickness of first metal film 2 and second metal film 3 was measured by polishing the cross-sectional surface of a plating film which had been formed as a first metal film 2 and a second metal film 3, and then measuring with a field emission scanning electron microscope (FE-SEM). The size of the precipitated particles in second metal film 3 was measured with a field emission scanning electron microscope (FE-SEM). The P concentration in the Ni alloy plating film was measured using a fluorescent X-ray film thickness measurement apparatus (XRF).

The bonding strength between the Ag plating film (second metal film 3) and bonding layer 4 containing Ag particles was measured as follows. Firstly, a Cu pin to which a Ni/Ag plating had been applied was prepared. Here, the Cu pin corresponds to metal plate 5. Thereupon, a conductive composition in the form of a paste containing Ag particles was applied to the front surface of second metal film 3, and the Cu pin was placed on top of this conductive composition. Next, bonding layer 4 containing Ag particles was formed by sintering the conductive composition in the form of a paste containing Ag particles, and the Cu pin was bonded to the surface of second metal film 3 via bonding layer 4 containing Ag particles. Subsequently, the bonding strength between second metal film 3 and bonding layer 4 containing Ag particles was measured by a tensile breakdown test.

The method of manufacturing the first to fourth samples is described in detail below. The present invention is not limited to the first to fourth samples, provided that there is no deviation from the essence of the invention.

First Sample

An Al—Si alloy film (conducting section 1) was formed by sputtering on one main surface (called the "front surface" below) of a 6-inch Si wafer. The thickness of the Al—Si alloy film was 5 μm. The Si wafer was then cut to a size of 10 mm longitudinal length by 10 mm lateral length, to obtain a plating substrate (semiconductor chip 20). Thereupon, the plating pre-processing was carried out on the substrate for plating.

The plating pre-processing on the substrate for plating was carried out as follows. Firstly, a degreasing process was carried out for 1 minute. In the degreasing process, soiling caused by organic material or inorganic material was removed from the surface of the material to receive plating (the plating substrate), and furthermore a degreasing treatment liquid (pre-processing liquid) was used to improve the wettability between the plating liquid and the surface of the material to receive plating on the side where the front surface electrode is formed (called the "front electrode surface" below). Next, an etching process was carried out for 50 seconds. In the etching process, an etching liquid (pre-processing liquid) for removing the oxide which has solidified on the front electrode surface was used.

Next, acid washing was carried out for 30 seconds using nitric acid. Thereupon, a first zincate process was carried out for 15 seconds. In the first zincate process, oxide on the front electrode surface was removed by an alkaline solution containing a zinc salt and having sodium hydroxide as a main component, and furthermore a zincate processing liquid (immersion zinc plating bath) which substitutes the aluminum with zinc and forms a zinc film on the front electrode surface was used. Next, a process (nitric acid stripping) for removing the immersion zinc layer using nitric acid was carried out for 1 minute. Thereupon, a second zincate process was carried out for 40 seconds using a zincate process liquid similar to that of the first zincate process, thereby completing the plating pre-processing.

Thereupon, an Ni alloy plating film (first metal film 2) was formed on the surface of the conducting section of the substrate for plating, by an NiP alloy plating process. An electroless NiP alloy plating process was carried out using a Ni plating solution (Ni plating bath) using hypophosphoric acid as a reducing agent, under processing conditions of bath temperature of 80° C. and pH 4.5. Next, a Ag plating film (second metal film 3) was formed on the surface of first metal film 2, by an immersion Ag plating process. The plating time used in the immersion Ag plating process was 5 minutes. The immersion Ag plating process was carried out using an immersion Ag plating solution (Ag plating bath) employing silver alkane sulfonate as a silver ion source, under process conditions of bath temperature 25° C. and pH 1.0 or lower.

Next, a discoloration inhibiting process was applied to second metal film 3. The discoloration inhibiting process was carried out for 1 minute at a bath temperature of 50° C. using a post-treatment agent which inhibits discoloration of the Ag by preferentially adsorbing thiol groups into the Ag active part in a solution containing thiol groups. Thereupon, a conductive composition in the form of a paste (Ag particle bonding material) having Ag particles with a particle size of the nanometer order disposed in an organic solvent binder was applied to the surface of second metal film 3. Here, a metal mask having a square opening section with a longitudinal length of 8 mm and a lateral length of 8 mm was used.

Next, a Cu pin to which a Ni/Ag plating had been applied was laid on the conductive composition in the form of a paste containing Ag particles, and pressure was applied at 10 MPa while heating at 250° C. Consequently, the conductive composition in the form of a paste containing Ag particles was sintered, formed a bonding layer containing Ag particles, and the Cu pin was bonded via bonding layer 4 containing Ag particles to the surface of second metal film 3.

As a result of this, as shown in FIG. 4, the thickness of first metal film 2 and the P concentration in the plating film (simply called the "P concentration" below) were respectively 5.0 μm and 7.1 wt %. The thickness and precipitated particle size of second metal film 3 were respectively 0.1 μm and 70 nm. The bonding strength between second metal film 3 and bonding layer 4 containing Ag particles was 61.1 MPa (the bonding strength is stated in the tensile strength column in the drawings, and the same applies to the second to fourth samples and the first to seventh comparative examples described below).

Second Sample

In the manufacture of the second sample, the plating time of the NiP alloy plating process was set to two times the plating time used in the manufacture of the first sample. The plating time of the immersion Ag plating process was set to six times the plating time used in the manufacture of the first sample. The bonding layer 4 containing Ag particles was formed by heating at 350° C. During this, no pressure was applied (pressure 0 MPa). Apart from this, the method of manufacture and the manufacturing conditions were the same as those used in the manufacture of the first sample.

As a result of this, as shown in FIG. 4, the thickness and the P concentration of first metal film 2 were 10 μm and 6.9 wt %, respectively. The thickness and precipitated particle size of second metal film 3 were 0.5 μm and 160 nm, respectively. The bonding strength between second metal film 3 and bonding layer 4 containing Ag particles was 45.5 MPa.

Third Sample

In the manufacture of the third sample, a conductive composition in the form of a paste containing Ag particles which was applied to the surface of second metal film 3 was pressurized at a pressure of 5 MPa while heating at 200° C., and second metal film 3 and a Cu pin were bonded. Apart from this, the method of manufacture and the manufacturing conditions were the same as those used in the manufacture of the first sample.

As a result of this, as shown in FIG. 4, the thickness and the P concentration of first metal film 2 were 5.2 μm and 7.0 wt %, respectively. The thickness and precipitated particle size of second metal film 3 were 0.1 μm and 70 nm, respectively. The bonding strength between second metal film 3 and bonding layer 4 containing Ag particles was 41.1 MPa.

Fourth Sample

In the manufacture of the fourth sample, an immersion Au plating process was carried out using an immersion Au plating bath (Au plating solution) employing gold sodium sulfite as a source of gold ions, under process conditions of bath temperature 75° C. and pH 7.3. Apart from this, the method of manufacture and the manufacturing conditions were the same as those used in the manufacture of the first sample.

As a result of this, as shown in FIG. 4, the thickness and the P concentration of first metal film 2 were 5.1 μm and 7.1 wt %, respectively. The thickness and precipitated particle size of second metal film 3 were 0.03 μm and 15 nm, respectively. The bonding strength between second metal film 3 and bonding layer 4 containing Ag particles was 53.2 MPa.

The method of manufacture of the first to seventh comparative examples will now be described in detail. In the first to seventh comparative examples, an NiP alloy plating film was formed as a metal film to compare with first metal film 2 of the first to fourth samples. An Ag plating film was formed as a metal film to compare with second metal film 3 of the first to fourth samples.

First Comparative Example

In the manufacture of the first comparative example, the plating time of the NiP alloy plating process was set to 1/10 of the plating time used in the manufacture of the first sample. Apart from this, the method of manufacture and the manufacturing conditions were the same as those used in the manufacture of the first sample.

As a result of this, as shown in FIG. 4, the thickness and the P concentration of the NiP alloy plating film were 0.8 μm and 7.0 wt %, respectively. Furthermore, in the first comparative example, an Ag plating film could not be formed on the surface of the NiP alloy plating film (indicated by an "x" in FIG. 4). The reason for this is inferred to be because the NiP alloy plating film is thin and therefore the surface of the conducting section (for example, the Al basis metal) is exposed due to the NiP alloy plating film being dissolved during the immersion Ag plating process.

Second Comparative Example

In the manufacture of the second comparative example, the NiP alloy plating process was carried out using an Ni plating solution which employs hypophosphoric acid as a reducing agent and yields a plating film having a P concentration of approximately 9 wt %. Apart from this, the method of manufacture and the manufacturing conditions were the same as those used in the manufacture of the first sample.

As a result of this, as shown in FIG. 4, the thickness and the P concentration of the NiP alloy plating film were 4.9 µm and 9.3 wt %, respectively. Furthermore, in the second comparative example, an Ag plating film could not be formed on the surface of the NiP alloy plating film (indicated by an "x" in FIG. 4). The reason for this is inferred to be because the P concentration of the NiP alloy plating film is high and therefore the corrosion resistance of the NiP alloy plating film is high, the reduction reaction of the Ag in the plating bath does not proceed normally, and hence the Ag plating film was not formed uniformly.

Third Comparative Example

In the NiP alloy plating process of the third comparative example, an Ni plating solution which employs hypophosphoric acid as a reducing agent and yields a plating film having a P concentration of approximately 2 wt % was used. Apart from this, the method of manufacture and the manufacturing conditions were the same as those used in the manufacture of the first sample.

As a result of this, as shown in FIG. 4, the thickness and the P concentration of the NiP alloy plating film were 4.9 µm and 2.1 wt %, respectively. The thickness and precipitated particle size of the Ag plating film were respectively 0.1 µm and 150 nm. Furthermore, in the third comparative example, a Cu pin could not be bonded to the Ag plating film (indicated as 0 MPa in FIG. 4). The reason for this is inferred to be because of excessive precipitation of the precipitated particles which form the Ag plating film, due to the low P concentration in the NiP alloy plating film.

Fourth Comparative Example

In the manufacture of the fourth comparative example, the plating time of the immersion Ag plating process was set to 20 times the plating time used in the manufacture of the first sample. Apart from this, the method of manufacture and the manufacturing conditions were the same as those used in the manufacture of the first sample.

As a result of this, as shown in FIG. 4, the thickness and the P concentration of the NiP alloy plating film were 5.2 µm and 7.0 wt %, respectively. The thickness and precipitated particle size of the Ag plating film were respectively 1.5 µm and 600 nm. The bonding strength between the Ag plating film and the bonding layer containing Ag particles was 13.8 MPa.

Fifth Comparative Example

In the manufacture of the fifth comparative example, a conductive composition in the form of a paste containing Ag particles applied to the surface of the Ag plating film was pressurized at a pressure of 10 MPa while heating at 150° C., and second metal film 3 and the Cu pin were bonded. Apart from this, the method of manufacture and the manufacturing conditions were the same as those used in the manufacture of the first sample.

As a result of this, as shown in FIG. 4, the thickness and the P concentration of the NiP alloy plating film were 5.0 µm and 6.9 wt %, respectively. The thickness and precipitated particle size of the Ag plating film were respectively 0.1 µm and 70 nm. The bonding strength between the Ag plating film and the bonding layer containing Ag particles was 14.9 MPa.

Sixth Comparative Example

In the manufacture of the sixth comparative example, a conductive composition in the form of a paste containing Ag particles applied to the surface of the Ag plating film was pressurized at a pressure of 10 MPa while heating at 450° C., and second metal film 3 and the Cu pin were bonded. Apart from this, the method of manufacture and the manufacturing conditions were the same as those used in the manufacture of the first sample.

As a result of this, as shown in FIG. 4, the thickness and the P concentration of the NiP alloy plating film were 5.0 µm and 6.9 wt %, respectively. The thickness and precipitated particle size of the Ag plating film were respectively 0.1 µm and 70 nm. The bonding strength between the Ag plating film and the bonding layer containing Ag particles was 15.5 MPa.

Seventh Comparative Example

In the manufacture of the seventh comparative example, the Ag plating film and a Cu pin were bonded by a solder bonding layer. More specifically, a Sn-3.5Ag lead-free solder was applied to the surface of the Ag plating film, a Cu pin was placed on the lead-free solder, and soldering was carried out by heating at a temperature of 280° C. in a heat treatment furnace having a hydrogen ($H_2$) atmosphere.

As a result of this, as shown in FIG. 4, the thickness and the P concentration of the NiP alloy plating film were 5.1 µm and 7.0 wt %, respectively. The thickness and precipitated particle size of the Ag plating film were respectively 0.1 µm and 70 nm. The bonding strength between the Ag plating film and the bonding layer containing Ag particles was 40.5 MPa.

From the results indicated by the first to fourth samples and the first to seventh comparative examples described above, it can be seen that the first to fourth samples had the same or higher bonding strength between second metal film 3 and bonding layer 4 containing Ag particles, compared to a conventional electronic component (see FIG. 11) which was manufactured as the seventh comparative example. On the other hand, in the first to sixth comparative examples, either a Ag plating film could not be formed to obtain a second metal film 3, or the bonding strength between the Ag plating film and bonding layer 4 containing Ag particles was low compared to the conventional electronic component which was manufactured as the seventh comparative example.

Accordingly, it could be seen that first metal film 2 desirably has a thickness greater than 0.8 µm and no greater than 10 µm. It could also be seen that first metal film 2 desirably has a P content greater than 2.1 wt % and less than 9.3 wt %. It could also be seen that second metal film 3 desirably has a thickness no less than 0.03 µm and less than 1.5 µm. It could also be seen that the precipitated particle size in second metal film 3 is desirably no less than 15 nm and less than 600 nm. It could also be seen that the heating temperature when bonding second metal film 3 and metal plate 5 is desirably higher than 150° C. and lower than 450° C.

Second Example

Figure 5:
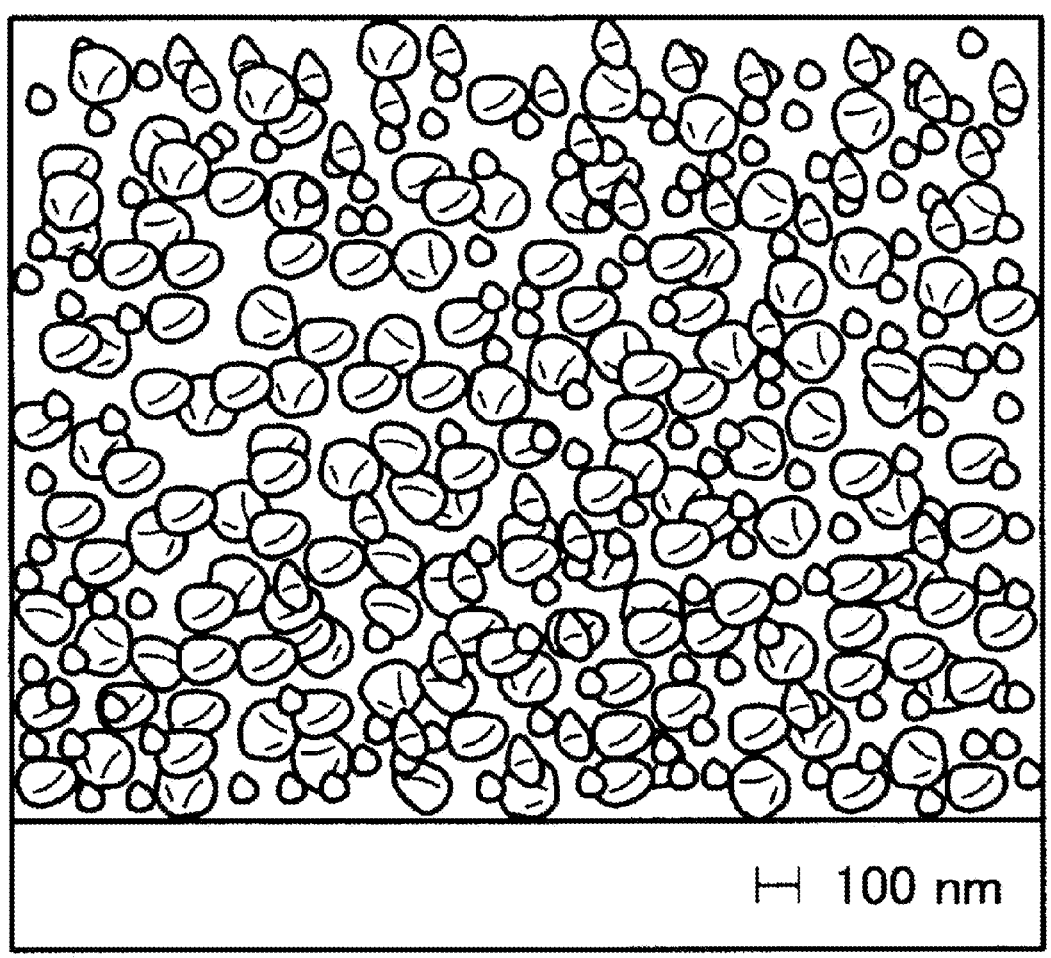
FIG. 5 is a plan diagram showing a schematic view of a metal film which constitutes an electronic component according to the present embodiment.
Figure 6:
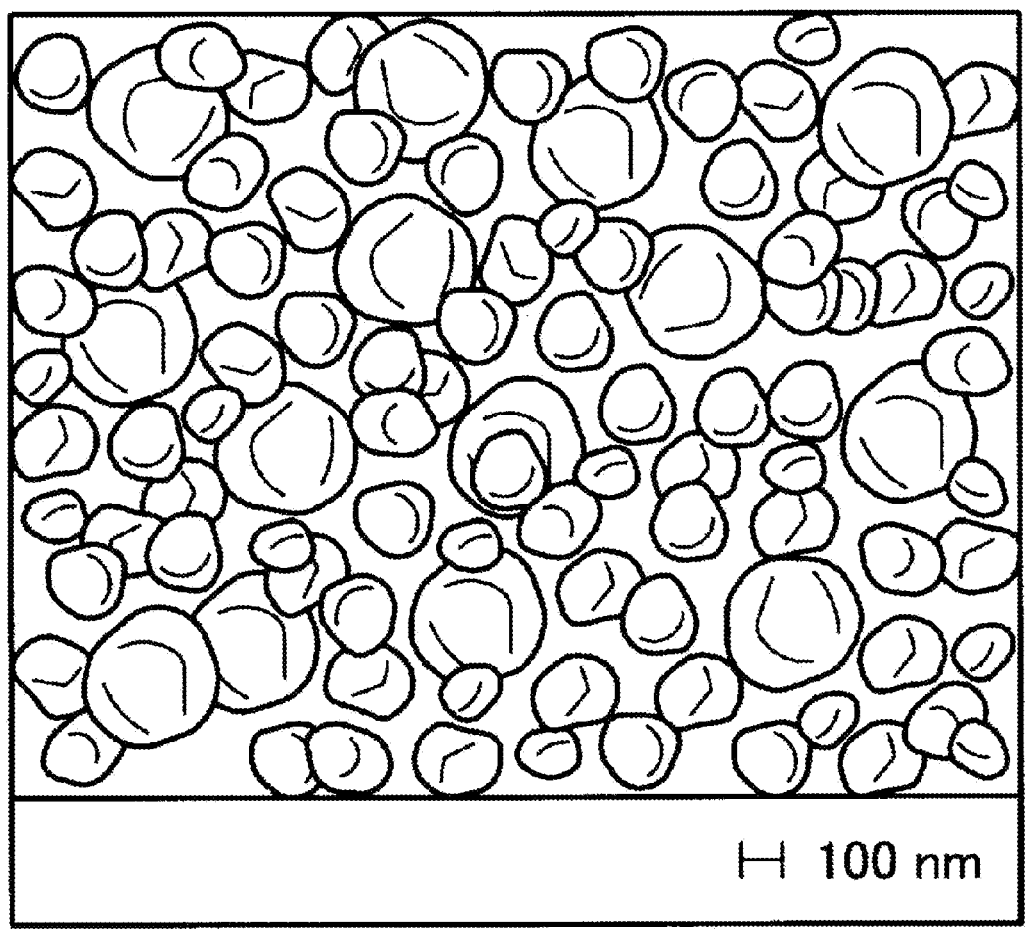
FIG. 6 is a plan diagram showing a schematic view of a metal film which constitutes an electronic component according to the present embodiment.
Figure 7:
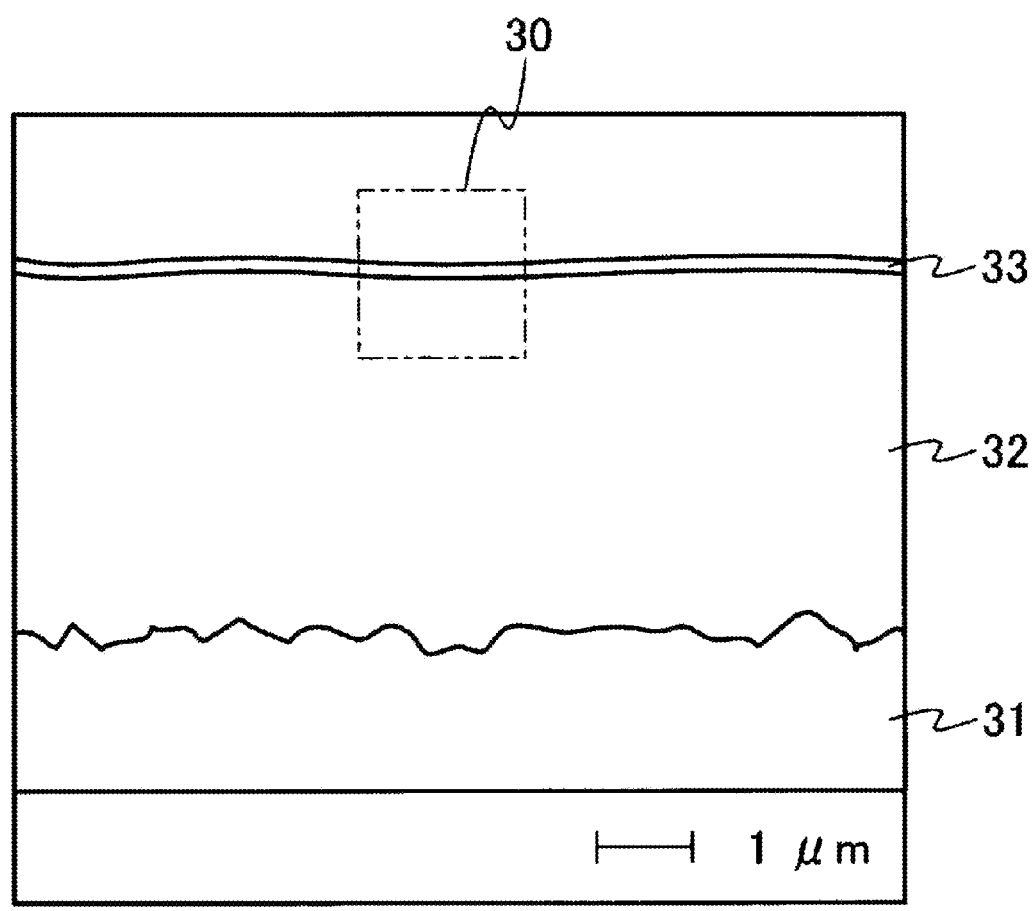
FIG. 7 is a plan diagram showing a schematic view of a metal film which constitutes an electronic component according to the present embodiment.
Figure 8:
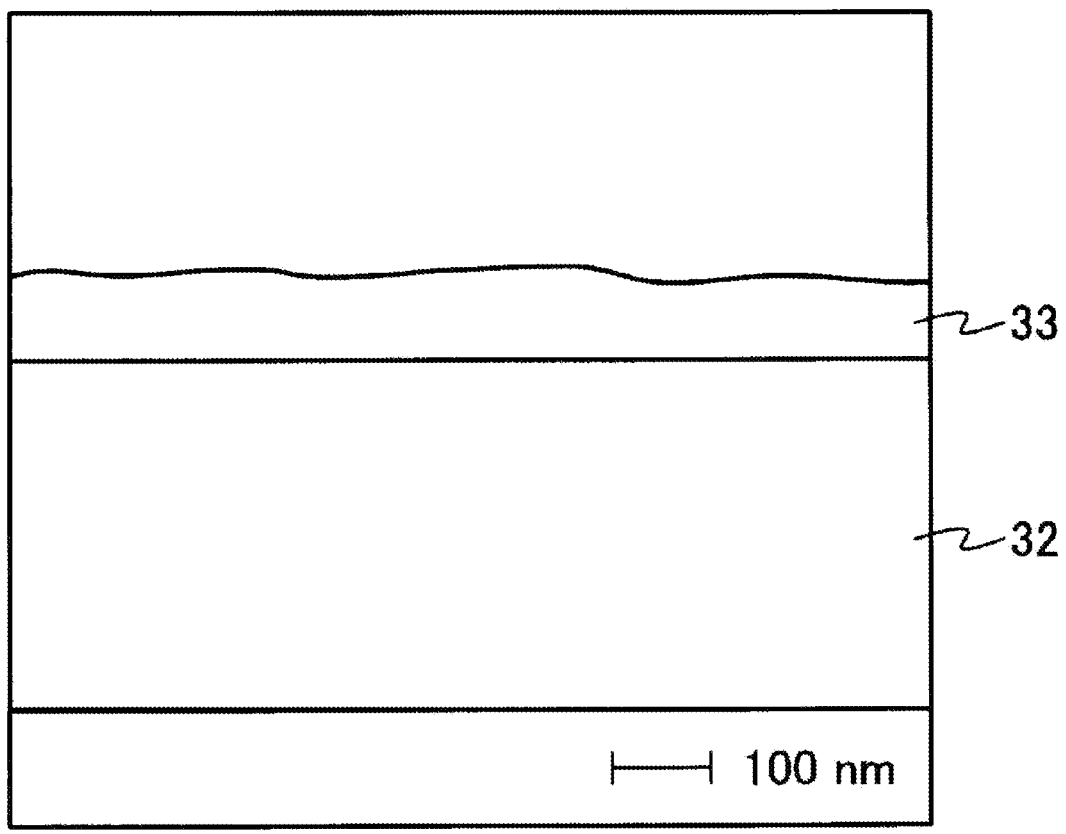
FIG. 8 is a cross-sectional diagram showing an enlarged view of one portion of the metal film shown in FIG. 7.

Next, the thickness and precipitated particle size of second metal film 3 were investigated. FIGS. 5 and 6 are plan diagrams showing a schematic view of a metal film constituting an electronic component relating to an embodiment of the invention. FIG. 7 is a cross-sectional diagram showing a schematic view of a metal film which constitutes an electronic component relating to an embodiment of the invention. FIG. 8 is a cross-sectional diagram showing an enlarged view of a portion of the metal film shown in FIG. 7. Firstly, similarly to the first example described above, a first and a second sample were manufactured. More specifically, in the first sample, second metal film 3 was formed by an immersion Ag plating process having a duration of 5 minutes. In the second sample, second metal film 3 was formed by an immersion Ag plating process having a duration of 30 minutes.

The surface of second metal film 3 of each sample was observed using a scanning electron microscope (SEM). FIG. 5 shows a conceptual diagram of precipitated particles viewed by observing second metal film 3 of the first sample in a direction perpendicular to the main plane of semiconductor chip 20. FIG. 6 shows a conceptual diagram of precipitated particles viewed by observing second metal film 3 of the second sample in a direction perpendicular to the main plane of semiconductor chip 20. FIGS. 7 and 8 show conceptual diagrams of first and second metal films 2 and 3 viewed by observing the first sample in a direction parallel to the main plane of semiconductor chip 20.

As shown in FIGS. 5 and 6, the longer the plating time of the immersion Ag plating process, the larger the precipitated particle size of second metal film 3. In this case, the thickness of second metal film 3 in the first and second samples was respectively 70 nm and 160 nm (see FIG. 4).

Furthermore, as shown in FIG. 7, a NiP alloy plating film 32 could be formed as a first metal film 2 on the surface of an aluminum electrode 31 which was to become a conducting section 1, and an Ag plating film 33 could be formed as a second metal film 3. Moreover, as shown in FIG. 8, the thickness of second metal film 3 of the first sample was 0.1 μm. Although not shown in the drawings, the thickness of second metal film 3 in the second sample was 0.5 μm. In other words, the thickness of second metal film 3 became greater in direct proportion to the size of the precipitated particles constituting second metal film 3.

Therefore, the relationship between the thickness and precipitated particle size of second metal film 3 and the plating time of the immersion Ag plating process was investigated. More specifically, second metal film 3 was formed by varying the plating time of the immersion Ag plating process between 3 minutes and 100 minutes, and the thickness and precipitated particle size of second metal film 3 was measured for each of the respective plating times. The results are shown in FIGS. 9 and 10.

Figure 9:
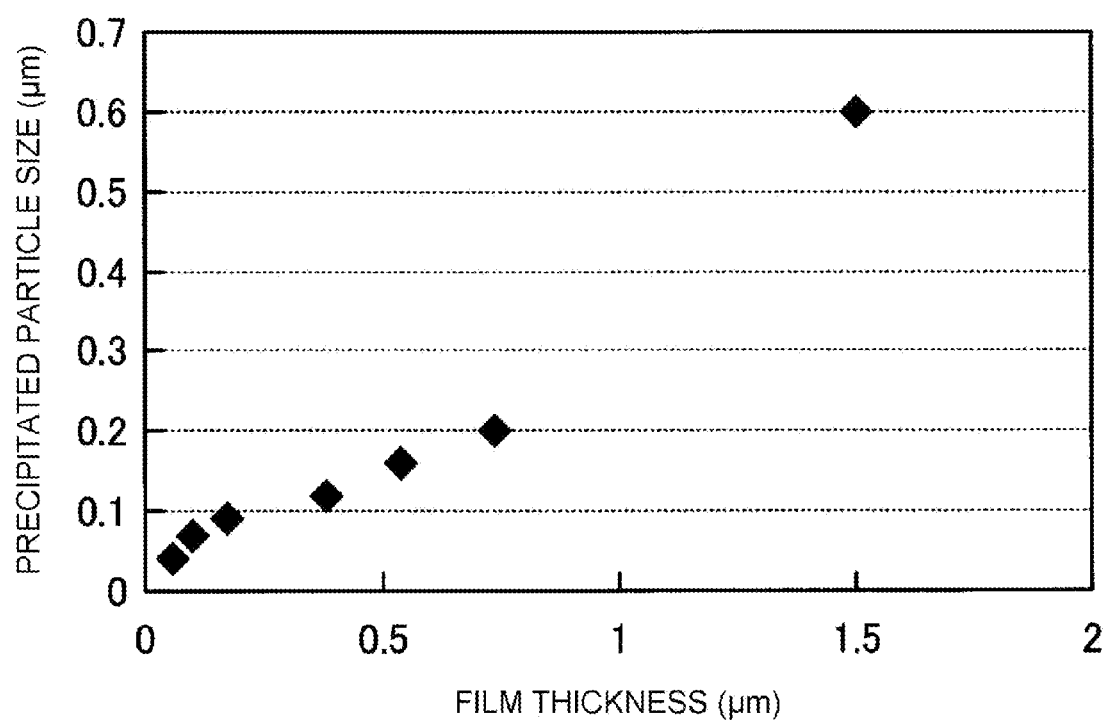
FIG. 9 is a characteristics diagram showing the characteristics of a metal film which constitutes an electronic component according to the present embodiment.

FIG. 9 is a characteristics graph showing the characteristics of a metal film which constitutes an electronic component according to an embodiment of the invention. FIG. 10 is a chart showing a relationship between the metal film constituting the electronic component according to the present embodiment and the plating time. As shown in FIG. 10, the thickness and precipitated particle size of second metal film 3 were respectively 0.056 μm and 0.04 μm when the plating time was 3 minutes, were respectively 0.101 μm and 0.07 μm when the plating time was 5 minutes, were respectively 0.175 μm and 0.09 μm when the plating time was 10 minutes, were respectively 0.38 μm and 0.12 μm when the plating time was 20 minutes, were respectively 0.538 μm and 0.16 μm when the plating time was 30 minutes, were respectively 0.74 μm and 0.2 μm when the plating time was 40 minutes, and were respectively 1.5 μm and 0.6 μm when the plating time was 100 minutes. It can be seen from FIG. 9 which illustrates these measurement results that the thickness and precipitated particle size of second metal film 3 have a directly proportional relationship.

In the foregoing description, the present invention was described with reference to a case in which the first metal film and the second metal film are formed by an electroless plating process, but the invention is not limited to the embodiments described above and it is also possible to form the first metal film and the second metal film by an electroplating process.

As described above, the electronic component and the method of manufacturing an electronic component according to the present invention are useful for a semiconductor apparatus having a package structure, such as an electronic component, having a composition in which respective members are bonded and electrically connected.

Thus, an electronic component and its method of manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. An electronic component, comprising:
   a conducting section provided on a surface of a semiconductor element;
   a first metal film provided on a surface of the conducting section;
   a second metal film provided on a surface of the first metal film; and
   a bonding layer provided on a surface of the second metal film and containing silver particles,
   wherein the thickness of the second metal film is greater than or equal to 0.03 μm and is less than 1.5 μm,
   wherein the second metal film is composed of particles having a diameter greater than or equal to 15 nm and less than 600 nm.

2. The electronic component according to claim 1, wherein the second metal film is made from a material having at least silver or gold as a main component.

3. The electronic component according to claim 1, wherein the second metal film is an electroplating film or an electroless plating film.

4. The electronic component according to claim 1, wherein the conducting section is made from a material having at least copper or aluminum as a main component.

5. The electronic component according to claim 1, wherein the first metal film is made from a material having nickel and phosphorus as main components.

6. The electronic component according to claim 5, wherein the first metal film is made from nickel-phosphorus, nickel-phosphorus-tungsten or nickel-phosphorus-molybdenum.

7. The electronic component according to claim 5, wherein the phosphorus content in the first metal film is greater than 2.1 wt % and less than 9.3 wt %.

8. The electronic component according to claim 1, wherein the thickness of the first metal film is greater than 0.8 μm and less than or equal to 10 μm.

9. The electronic component according to claim 1, wherein the first metal film is an electroplating film or an electroless plating film.

10. The electronic component according to claim 1, wherein the bonding layer is a sintered body formed by heating at a temperature higher than 150° C. and less than 450° C., with or without application of pressure.

11. A method of manufacturing an electronic component, comprising the steps of:
    forming a first metal film on a surface of a conducting section provided on a surface of the semiconductor wafer;
    forming a second metal film to a thickness of greater than or equal to 0.03 μm and less than 1.5 μm on a surface of the first metal film, wherein the second metal film is composed of particles having a diameter no less than 15 nm and less than 600 nm;
    applying a conductive material containing silver particles to a surface of the second metal film; and
    sintering the conductive material by heat treatment.

12. The method of manufacturing an electronic component according to claim 11, wherein the second metal film is formed by immersing the semiconductor wafer on which the first metal film has been formed, in a solution containing a metal having a lower ionization tendency than the first metal film, or a solution containing a material which promotes precipitation of metal on the surface of the first metal film.

13. The method of manufacturing an electronic component according to claim 11, wherein the second metal film is formed by an electroless plating process.

14. The method of manufacturing an electronic component according to claim 11, wherein the second metal film is formed by an electroplating process.

15. The method of manufacturing an electronic component according to claim 11, wherein the second metal film is formed from a material having at least silver or gold as a main component.

16. The method of manufacturing an electronic component according to claim 11, wherein the conducting section is formed from a material having at least copper or aluminum as a main component.

17. The method of manufacturing an electronic component according to claim 11, wherein the first metal film is formed from a material having nickel and phosphorus as main components.

18. The method of manufacturing an electronic component according to claim 17, wherein the first metal film is formed from nickel-phosphorus, nickel-phosphorus-tungsten or nickel-phosphorus-molybdenum.

19. The method of manufacturing an electronic component according to claim 17, wherein the first metal film is formed with a phosphorus content greater than 2.1 wt % and less than 9.3 wt %.

20. The method of manufacturing an electronic component according to claim 11, wherein the first metal film is formed to a thickness greater than 0.8 μm and no greater than 10 μm.

21. The method of manufacturing an electronic component according to claim 11, wherein the first metal film is formed by an electroplating process or an electroless plating process.

22. The method of manufacturing an electronic component according to claim 11, wherein, in the heat treatment, the conductive material is sintered by heating at a temperature higher than 150° C. and less than 450° C.

23. The method of manufacturing an electronic component according to claim 11, wherein, in the heat treatment, the conductive material is sintered by applying pressure while heating at a temperature higher than 150° C. and less than 450° C.

* * * * *